(12) United States Patent
Iwafuchi et al.

(10) Patent No.: US 6,969,624 B2
(45) Date of Patent: Nov. 29, 2005

(54) METHOD OF TRANSFERRING A DEVICE, A METHOD OF PRODUCING A DEVICE HOLDING SUBSTRATE, AND A DEVICE HOLDING SUBSTRATE

(75) Inventors: Toshiaki Iwafuchi, Kanagawa (JP); Yoshiyuki Yanagisawa, Kanagawa (JP); Toyoharu Oohata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/059,865

(22) Filed: Feb. 17, 2005

(65) Prior Publication Data

US 2005/0148106 A1 Jul. 7, 2005

Related U.S. Application Data

(63) Continuation of application No. 10/024,690, filed on Dec. 14, 2001, now Pat. No. 6,939,729.

(30) Foreign Application Priority Data

Dec. 14, 2000 (JP) ............................ P2000-380944

(51) Int. Cl.[7] ............................................. H01L 21/00
(52) U.S. Cl. ........................ 438/22; 438/458; 438/464
(58) Field of Search ........................ 438/22, 458, 464, 438/928, 977

(56) References Cited

U.S. PATENT DOCUMENTS

| 5,747,217 | A | * | 5/1998 | Zaklika et al. | ............... 430/158 |
| 6,757,314 | B2 | * | 6/2004 | Kneissl et al. | ................ 372/50 |
| 6,770,337 | B2 | * | 8/2004 | Debe et al. | ................ 428/32.6 |
| 2002/0082543 | A1 | * | 6/2002 | Park et al. | ..................... 604/21 |
| 2003/0017712 | A1 | * | 1/2003 | Brendel | ....................... 438/758 |

* cited by examiner

*Primary Examiner*—Caridad Everhart
(74) *Attorney, Agent, or Firm*—Bell, Boyd & Lloyd LLC

(57) ABSTRACT

The interface between a first substrate and light-emitting diodes formed on the first substrate is selectively irradiated with an energy beam and transmits the energy beam through the first substrate, thereby selectively releasing the light-emitting diodes. The light-emitting diodes are then transferred onto a device holding layer included on a device holding substrate. Subsequently, the light-emitting diodes are transferred onto a second substrate. The irradiation of the interface with the energy beam enables the devices to be easily released from the first substrate.

6 Claims, 8 Drawing Sheets

F I G. 16
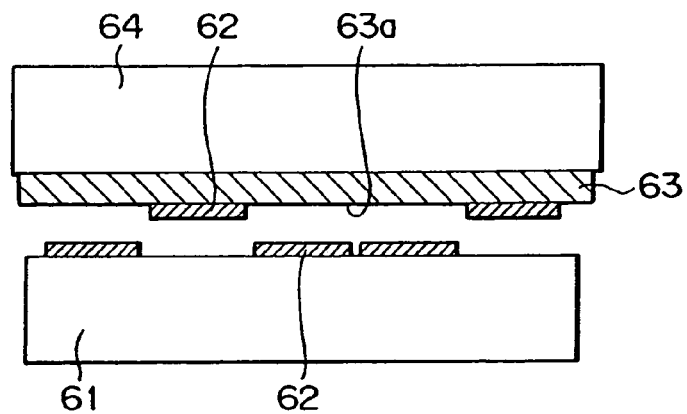
F I G. 17
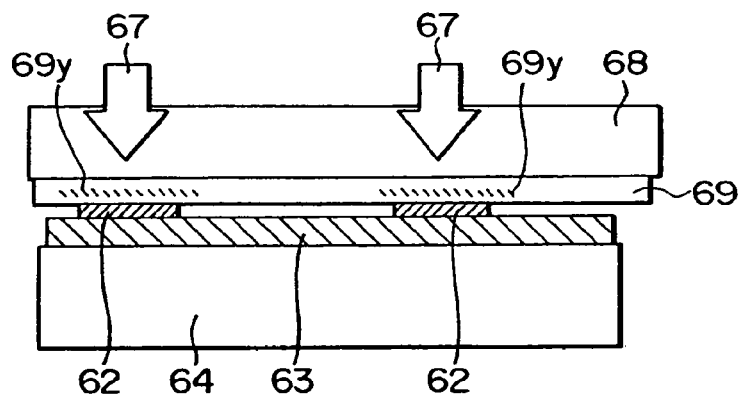
F I G. 18
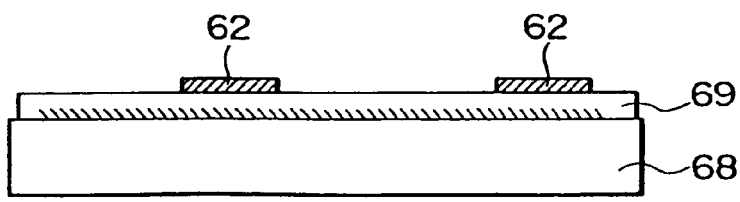

METHOD OF TRANSFERRING A DEVICE, A METHOD OF PRODUCING A DEVICE HOLDING SUBSTRATE, AND A DEVICE HOLDING SUBSTRATE

CROSS REFERENCE TO RELATED APPLICATIONS

The present application claims priority to U.S. patent application Ser. No. 10/024,690 filed on Dec. 14, 2001, the disclosure of which is herein incorporated by reference; and the present invention claims priority to Japanese Patent Application No. P2000-380944 filed on Dec. 14, 2000, the disclosure of which is herein incorporated by reference.

BACKGROUND OF THE INVENTION

The present invention relates to a method of transferring a device for selectively releasing a minutely processed device and transferring the device onto another substrate, a method of producing a device holding substrate, and a device holding substrate.

In the case of assembling an image display device by arranging light-emitting devices in a matrix, the devices are either included on a substrate as in liquid crystal display devices (LCDs) or plasma display panels (PDPs), or singular light-emitting diode (LED) packages are arranged as in light-emitting diode displays (LED displays). In an image display device such as an LCD and a PDP, separation of the devices is impossible with respect to the pitch of the devices or pixels and the production process thereof. Also, the devices are ordinarily spaced from each other by the pixel pitch of the image display device from the beginning of the production process which makes separation impossible.

Not limited to the light-emitting devices, there are semiconductor thin film devices or high density semiconductor devices included on a substrate and used to transfer the devices onto another substrate. For example, in a method for transferring a thin film device disclosed in Japanese Patent Laid-open No. Hei 11-26733, a substrate is used at the time of producing thin-film devices into liquid crystal control devices. This substrate is different from a substrate that is used at the time of mounting the product, where the thin-film devices are transferred onto the substrate used at the time of mounting. Another known transfer technique, for example, is the transferring method disclosed in Japanese Patent Laid-open No. Hei 7-254690. In this patent, a film capable of generating minute bubbles is included at the boundary portion between a substrate and a device (semiconductor plate). The film is irradiated with a laser beam to generate the minute bubbles when the device (semiconductor plate) is transferred to the side of a support. Furthermore, according to the technique disclosed in Japanese Patent Laid-open No. Hei 11-142878, thin-film transistors including a liquid crystal display portion on a first substrate are transferred entirely onto a second substrate, and then selectively transferred from the second substrate onto a third substrate corresponding to the pixel pitch.

However, the transfer techniques as mentioned above have the following problems. First, in the method of transferring a thin-film device disclosed in Japanese Patent Laid-open No. Hei 11-26733, a thermo-melting adhesive layer of a second separation layer undergoes ablation upon irradiation with laser light, and also generates a gas or the like, where the treatment of the gas or the like is a problem on a process basis. In addition, a portion of the thermo-melting adhesive layer is left on the device after the device is transferred onto a secondary transfer body. As a result, the adhesive layer residue must be removed using xylene or a similar solvent. Also, to adhere the device to the secondary transfer body an adhesive layer such as an epoxy resin is cured. A substantial period of time is required to cure the epoxy resin. Furthermore, in order to release the thin-film devices such as thin-film transistors from the entire substrate, amorphous silicon must be preliminarily provided on the whole surface of the substrate, and the whole surface must be irradiated with laser light.

In the transferring method disclosed in Japanese Patent Laid-open No. Hei 7-254690, only a laser light is transmitted through the transparent portions of the support body, so that only the transparent portions of the body enable the laser light to pass through the body. In addition, this patent describes that sufficient binding energy is provided between the semiconductor plate and the support body to promote adhesion between the support body and the semiconductor plate. However, the absorption of laser light occurs between the semiconductor plate and the support body, so that bubbles are generated by ablation to break the semiconductor devices, resulting in a decrease of yield.

In the technique disclosed in Japanese Patent Laid-open No. Hei 11-142878, the portions of the thin-film transistor devices to be transferred are selectively irradiated with UV light to lower the adhesive power of a UV release resin provided between the thin-film transistors and the substrate from which the transistors are to be transferred. However, it takes time for the adhesive power of the UV release resin to be lowered by irradiation with UV light, which leads to the lowering of throughput on a process basis. In addition, when the adhesive power is not sufficiently lowered, the transfer is also lowered.

SUMMARY OF THE INVENTION

The present invention in an embodiment provides a method of transferring a device, a method of producing a device holding substrate, and a device holding substrate which enable minutely processed devices to be transferred in a short time without inducing an increase in the number of steps and without lowering the yield of transfer.

In order to solve the above-mentioned problems, a method of transferring a device according to the present invention includes the steps of irradiating a select interface between a first substrate and a device included on the first substrate with an energy beam and transmitting the energy beam through the first substrate to selectively release the device, transferring the device onto a device holding layer included on a device holding substrate, and transferring the device from the device holding layer onto a second substrate.

In the method of transferring a device as described above, the energy beam selectively irradiates the interface between the device and the first substrate to release the device from the first substrate. Therefore, the energy from the beam is not wasted in needless portions, and the release of the device from the substrate is carried out in a short time. In addition, since the interface between the device and the substrate is not specially formed but is formed spontaneously in the process of forming the device, the increase in the number of steps to release the device is minimized.

In the present invention, a device including a material that generates ablation upon irradiation with an energy beam can be used. For example, a semiconductor light-emitting device or the like made of a nitride semiconductor material can be used. The semiconductor light-emitting device made with the nitride semiconductor material can be produced by crystal growth on a sapphire substrate. The sapphire substrate transmits a desired energy beam, so that the energy beam for generating release of the device is directed to the interface between the sapphire substrate and the semiconductor light-emitting device.

In addition, a method of producing a device holding substrate according to the present invention includes the steps of preparing a substrate that includes a device having a pointed head portion; providing an uncured silicone resin layer on a device holding substrate; adhering the substrate that includes the device having the pointed head portion to the device holding substrate; and providing a recessed portion in the surface of the silicone resin layer that is shaped to fit the pointed head portion.

Because the silicone resin layer includes a surface with a recessed portion shaped to fit the pointed head portion of the device, the pointed head portion of the device can be securely held without staggering the position of the device. Furthermore, the silicone resin layer includes a surface which itself has a sticky property, so that the device can be securely held when the pointed head portion is fitted with the recessed portion.

The above and other objects, features and advantages of the present invention will become apparent from the following description and appended claims, taken in conjunction with the accompanying drawings which show by way of example some preferred embodiments of the present invention.

BRIEF DESCRIPTION OF THE FIGURES

FIG. 16 is a sectional view showing the step of releasing thin-film transistor devices in the method of transferring a device according to an embodiment of the present invention.

FIG. 17 is a sectional view showing the step of adhering the thin-film transistor devices to a second substrate in the method of transferring a device according to an embodiment of the present invention.

FIG. 18 is a sectional view showing the step of transferring the thin-film transistor devices onto a second substrate in the method of transferring a device according to an embodiment of the present invention.

DETAILED DESCRIPTION OF THE INVENTION

Now, the embodiments of the present invention will be described in detail below with reference to the drawings. The first embodiment is an example of a method of selectively transferring a flat, plate-shaped light-emitting diode the second embodiment is an example of a method of selectively transferring a light-emitting diode having a pointed head portion. The third embodiment is an example of a method of producing a device holding substrate using a silicone resin layer.

Figure 1:
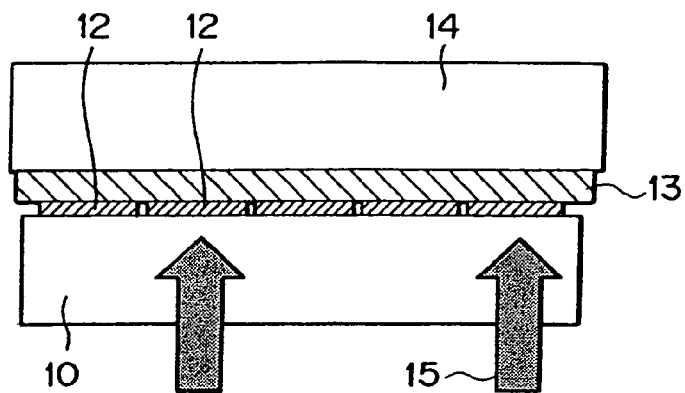
FIG. 1 is a step sectional view showing the step of irradiating the interface with laser light in a method of transferring a device according to a first embodiment of the present invention.

The method of transferring a device according to the first embodiment will be described referring to FIGS. 1 to 5. First, as shown in FIG. 1, a number of light-emitting diodes 12 are provided in a matrix arrangement on a sapphire substrate 10, which is a light-transmitting first substrate. The light-emitting diode 12 is a device composed of a nitride semiconductor material such as gallium nitride and, in one example, has a double hetero structure in which an active layer is sandwiched between clad layers. The light-emitting diode 12 is formed by layering a gallium nitride crystal layer or the like through selective growth on the sapphire substrate 10. In FIG. 1, a desired light-emitting region is already formed but final wiring is not yet provided. The light-emitting diodes 12, which are arranged in a matrix form, are individually separated and disposed on the sapphire substrate 10. The diodes can be individually separated by, for example, RIE (reactive ion etching) or the like. The light-emitting diodes 12 are substantially flat and plate shaped. The active layer and the clad layers of the light-emitting diodes 12 are extended in parallel with the major surface of the sapphire substrate 10.

A device holding substrate 14, for temporarily holding the light-emitting diodes 12, is prepared. Also, a device holding layer 13 is included on a surface of the device holding substrate 14 facing the sapphire substrate 10. The device holding substrate 14 is a substrate having a desired stiffness, and may be one of various substrates such as a semiconductor substrate, a quartz glass substrate, a glass substrate, a plastic substrate and a metallic substrate. The device holding substrate 14 does not need to transmit light such as laser light, so that the substrate does not need to be formed of a light-transmitting material. The device holding layer 13 is an adhesive layer which is temporarily adhered to the surface of the light-emitting diodes 12, to hold the light-emitting diodes 12. The device holding layer 13 may be formed of a thermoplastic resin or a thermosetting resin, and is preferably formed of a silicone resin. The silicone resin does not suffer ablation even when irradiated with excimer laser or YAG laser light, and only the devices are released, so that yield of the devices is enhanced.

The device holding substrate 14 provided thereon with the device holding layer 13, is positioned to face the major surface of the sapphire substrate 10. A number of light-emitting diodes 12 are pressed and adhered to the surface of the device holding layer 13 at a desired pressure. Next, as shown in FIG. 1, selective irradiation with laser light 15, such as an excimer laser, YAG laser or the like, is carried out to cause laser ablation at the interface between the selected light-emitting diodes 12 and the sapphire substrate 10. Laser ablation is a phenomenon in which a fixed material, having absorbed the irradiation light, is photochemically or thermally excited, bonds of atoms or molecules at the surface or inside of the excited material are broken, and the atoms or molecules are discharged from the surface. Primarily, it appears as a phenomenon in which the whole or a part of the fixed material undergoes a phase change such as melting, evaporation and gasification. By using laser ablation, the GaN-based material is decomposed into metallic Ga and nitrogen and a gas is generated between the selected light-emitting diodes and the sapphire substrate 10. Therefore, the light-emitting diodes 12 are released easily from the substrate 10. The laser light 15 is preferably an excimer laser because it has a high output in short wavelength regions. Thus, instantaneous processing is possible. The light-emitting diodes 12 are selectively irradiated with the laser light 15. To perform the selective irradiation, a mask having desired opening portions or scanning with controlled irradiation and non-irradiation may be used.

Figure 2:
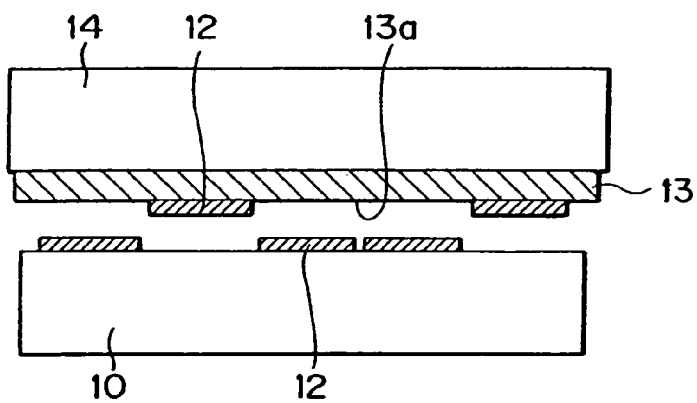
FIG. 2 is a sectional view showing the step of transferring the light-emitting diodes in the method of transferring a device according to the first embodiment of the present invention.

FIG. 2 shows the light-emitting diodes 12 being selectively released from the substrate by the laser ablation, and adhered to the surface 13a of the device holding layer 13, which are held on the side of the device holding substrate 14.

Figure 3:
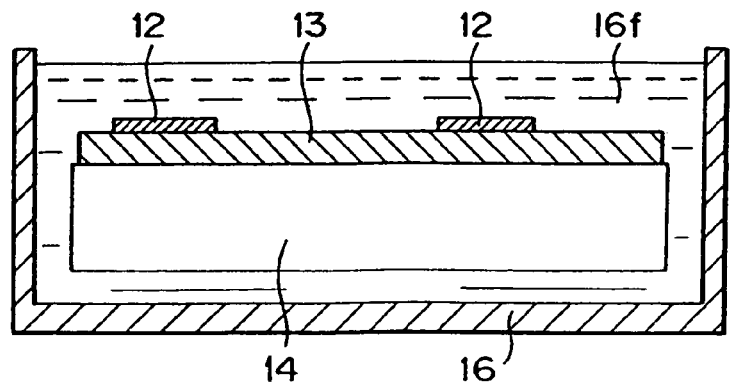
FIG. 3 is a sectional view showing the step of cleaning the light-emitting diodes in the method of transferring a device according to the first embodiment of the present invention.

Next, as shown in FIG. 3, the device holding substrate 14 having the light-emitting diodes 12 is immersed in a cleaning liquid 16f in a cleaning tank 16. The metal or the like that remains on the surfaces of the light-emitting diodes 12 is removed by cleaning. The metal consists mainly of metallic Ga formed upon evaporation of nitrogen by the laser ablation. A cleaning liquid 16f including both alkaline and acid etching liquids may be used. Also in this step, if a silicone resin is used as the device holding layer 13, cleaning can be conducted with the light-emitting diodes 12 adhered to the surface 13a of the device holding layer 13. In addition, since the silicone resin is resistant to alkalis and acids, it does not erode and holds the light-emitting diodes 12.

Figure 4:
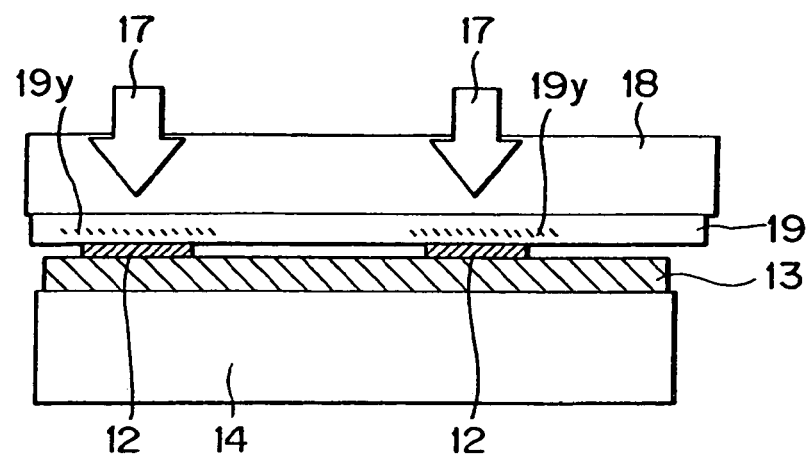
FIG. 4 is a sectional view showing the step of transferring the light-emitting diodes onto a second substrate in the method of transferring a device according to the first embodiment of the present invention.

After the cleaning of the light-emitting diodes 12, as shown in FIG. 4, a second substrate 18, having an adhesive layer 19 on its major surface, is prepared. The second substrate 18 is formed of a light-transmitting material such as quartz glass, and the adhesive layer 19 may be formed of a UV-curable adhesive, a thermosetting adhesive, a thermoplastic adhesive or the like. The second substrate 18 including the adhesive layer 19 on its major surface is mated with the device holding substrate 14 having the light-emitting diodes 12. Then, irradiation with energy light 17 is conducted, whereby the light-emitting diodes 12 on the device holding substrate 14 are transferred onto the second substrate 18. Where the adhesive layer 19 is formed of a UV-curable adhesive, the adhesive layer 19 can be cured by irradiating the adhesive layer 19 with UV light such as energy light 17. An uncured region 19y of the adhesive layer 19 is brought into contact with the light-emitting diodes 12, and then irradiated with UV light whereby the light-emitting diodes 12 are securely adhered to the second substrate. Where the adhesive layer 19 is formed of a thermosetting adhesive or a thermoplastic adhesive, irradiation with infra-red laser light is conducted and adhesion is achieved through curing or re-melting. Adhesion of the light-emitting diodes 12 may be achieved by curing or re-melting only the regions corresponding to the light-emitting diodes 12. Alternatively, adhesion of the light-emitting diodes 12 may be achieved by curing or re-melting the entire surface of the adhesive layer 19. Particularly, where a silicone resin is used as the device holding layer 13, the excellent release property of the silicone resin ensures easy release of the device holding substrate 14. The easy release of the device or devices occurs even when the adhesive layer 19 and the device holding layer 13 make contact with each other.

Figure 5:
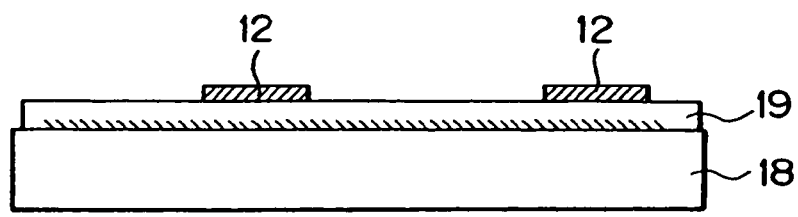
FIG. 5 is a sectional view showing the condition of the device after the step of transferring the light-emitting diodes onto the second substrate in the method of transferring a device according to the first embodiment of the present invention.

Finally, as shown in FIG. 5, the device holding substrate 14 is removed along with the device holding layer 13, to yield the second substrate 18 including the light-emitting diodes 12 which have been selectively transferred to the second substrate.

In the method of transferring a device as described above, the energy beam for release of the device selectively irradiates the interface between the device and the first substrate. Thus, the release of the device by laser ablation at the interface between the device and the substrate is achieved in a short time, and the device is not damaged. The interface between the device and the substrate is not specially formed, but is formed spontaneously in the process of forming the device. Therefore, the formation of a thin release film for the purpose of releasing the device is needless. This reduces the number of steps required in the transfer process. Also, the light-emitting diodes 12 are flat plate shaped diodes, which are securely adhered to the device holding layer 13 formed of, for example, a silicone resin or the like, and are transferred without positional stagger. Therefore, an image display device or similar device can be produced while restraining a lowering in production.

Figure 6A:
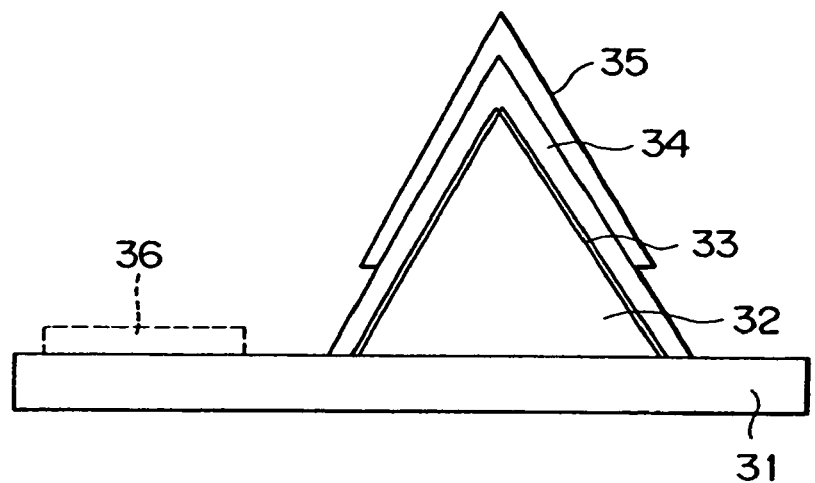
FIG. 6A is a sectional view showing another embodiment of the light-emitting device used in the method of transferring a device according to the present invention.
Figure 6B:
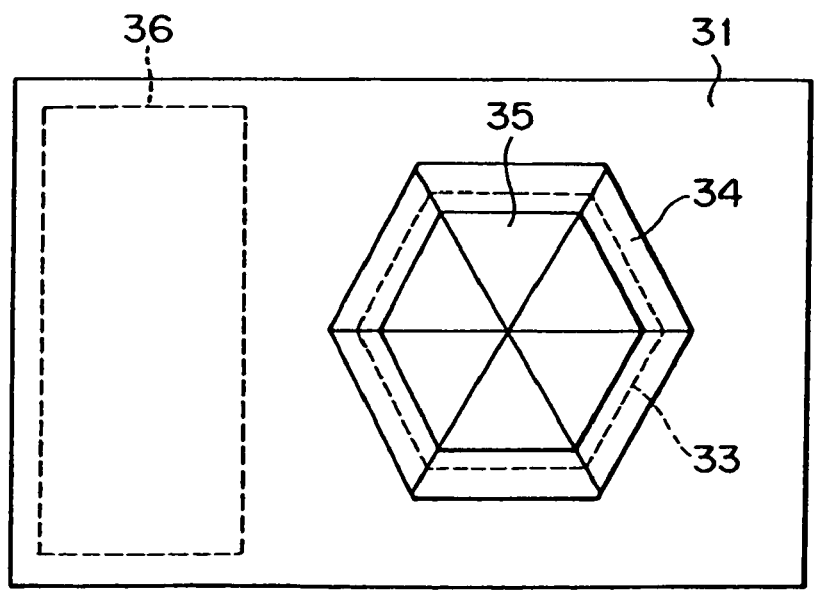
FIG. 6B is a sectional view showing another embodiment of the light-emitting device used in the method of transferring a device according to the present invention.

In a second embodiment, the method of transferring a device is employed to transfer a light-emitting device having the structure shown in FIG. 6. The light-emitting device includes a pointed head portion. FIG. 6A is a sectional view of the device, and FIG. 6B is a plan view of the same. The light-emitting device is a GaN-based light-emitting diode and a device formed by crystal growth on, for example, a sapphire substrate. In such a GaN-based light-emitting diode, irradiation with a laser transmitted through the substrate causes laser ablation. As a result, film exfoliation is generated at the interface between the sapphire substrate and the GaN-based growth layer based on the phenomenon of gasification of nitrogen of GaN, and the device can be easily separated from the substrate.

First, as for the structure, a hexagon pyramid shaped GaN layer 32 is selectively grown on a ground growth layer 31 constituted of a GaN-based semiconductor layer. An insulating layer (not shown) is present on the ground growth layer 31, and the hexagon pyramid shaped GaN layer 32 is formed at a portion where the insulating film is opened, by MOCVD method or the like. The GaN layer 32 is a pyramid shaped growth layer covered with S planes (1-101 planes) where the major surface of the sapphire substrate used at the time of growth is made to be C plane and is doped with silicon. The portions of the inclined S planes of the GaN layer 32 function as clads of a double hetero structure. An InGaN layer 33, as an active layer, is formed so as to cover the inclined S planes of the GaN layer 32, and a magnesium-doped GaN layer 34 is formed on the outside thereof. The magnesium-doped GaN layer 34 also functions as a clad.

The light-emitting diode is provided with a p electrode 35 and an n electrode 36. The p electrode 35 is formed on the magnesium-doped GaN layer 34 by vapor deposition of a metallic material such as Ni/Pt/Au or Ni(Pd)/Pt/Au. The n electrode 36 is formed at the portion where the insulating film (not shown) is opened as above, by vapor deposition of a metallic material such as Ti/Al/Pt/Au. Where the n electrode is taken out from the back side of the ground growth layer 31, formation of the n electrode 36 is not required on the face side of the ground growth layer 31.

The GaN-based light-emitting diode with such a structure is capable of blue light emission and includes a hexagon pyramid shaped pointed head portion. Therefore, the device is easily released from the sapphire substrate by laser ablation, so that the release can be achieved by selective irradiation with a laser beam. The GaN-based light-emitting diode may have a structure comprising an active layer in a flat plate shape or band shape, and may be an angular pyramid structure having a C plane at a top end portion thereof. Other nitride-based light-emitting devices and compound semiconductor devices may also be applied.

Referring now to FIGS. 7 to 11, a number of light-emitting diodes 42, each having a hexagon pyramid shaped pointed head portion 42a, are formed in a matrix arrangement on a sapphire substrate 40, which is a light-transmitting first substrate. The light-emitting diode 42 is a device composed of a nitride semiconductor material such as gallium nitride, and as an example, has a double hetero structure including an active layer sandwiched between clad layers. The light-emitting diode 42 is formed by laminating a gallium nitride crystal layer or the like by selective growth on the sapphire substrate 40 having a major surface as C plane. It is to be noted that in FIG. 7, a desired light-emitting region has been formed but without the final wiring. The light-emitting diodes 42 are individually separated and disposed in the matrix arrangement on the sapphire substrate 40. The individual separation of the devices can be achieved, for example, by RIE (reactive ion etching) or the like. The active layer and the clad layers of the light-emitting diode 42 are extended parallel to the slant surfaces of the pointed head portion 42a.

A device holding substrate 44 for temporarily holding the light-emitting diodes 42 is prepared, and the device holding substrate 44 includes a silicone resin layer 43 on its surface which is positioned to face the sapphire substrate 40. The device holding substrate 44 is a substrate having a desired stiffness, and may be one of various substrates such as a quartz glass substrate, a glass substrate, a plastic substrate, and a metallic substrate. The device holding substrate 44 need not specially transmit laser light or the like, and need not be formed of a light-transmitting material. The silicone resin layer 43 is an adhesive layer for temporarily adhering to the surface of the light-emitting diodes 42 and holding the light-emitting diodes 42. The surface of the silicone resin layer 43 includes a number of recessed portions 43b at the positions of the light-emitting diodes 42. Each of the recessed portions 43b has a shape of a female die where the pointed head portion 42a of the light-emitting diode 42 has a shape of a male die, so that the pointed head portion 42a fits the recessed portion 43b. Particularly, a silicone resin can be used for forming the device holding layer, whereby ablation is not generated upon irradiation with excimer laser or YAG laser light. Thus, only the devices can be released from the substrate and production is enhanced.

Figure 7:
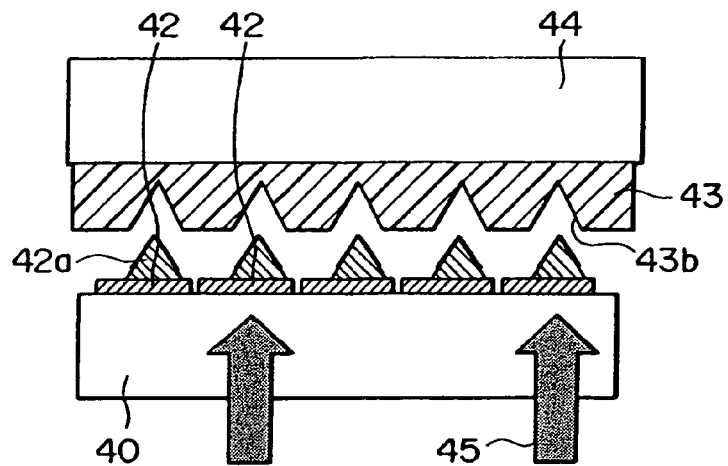
FIG. 7 is a sectional view showing the step of irradiating the interface with laser light in a method of transferring a device according to the embodiment of FIGS. 6A and 6B.

The device holding substrate 44 including the silicone resin layer 43 on its surface is positioned to face the major surface of the sapphire substrate 40. The number of light-emitting diodes 42 are pressed and adhered to the surface of the silicone resin layer 43 at a desired pressure. Next, as shown in FIG. 7, selective irradiation with laser light 45 generated by an excimer laser or YAG laser is conducted to cause laser ablation at the interface between the selected light-emitting diodes 42 and the sapphire substrate 40. By the laser ablation, the GaN-based material is decomposed into metallic Ga and nitrogen, which the results in the generation of a gas, between the selected light-emitting diodes 42 and the sapphire substrate 40. As a result, the light-emitting diodes 42 are easily released from the substrate. The laser light 45 is preferably generated by an excimer laser because this type of laser produces high output in short wavelength regions. In this manner, instantaneous processing can be achieved. The laser light 45 selectively irradiates the selected light-emitting diodes 42. To selectively irradiate the devices, a mask having desired opening portions or scanning with controlled irradiation and non-irradiation may be used.

Figure 8:
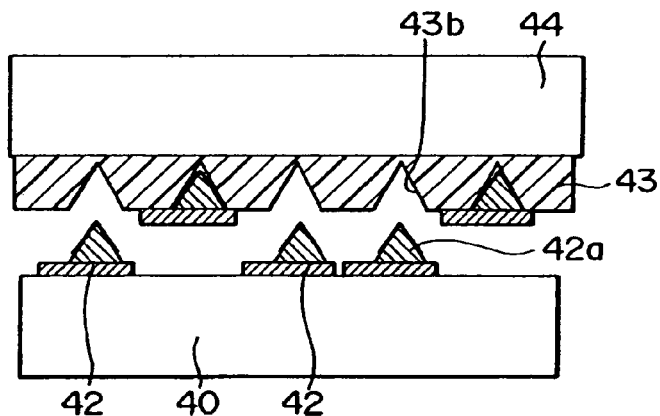
FIG. 8 is a sectional view showing the step of transferring the light-emitting diodes in the method of transferring a device according to the embodiment of FIGS. 6A and 6B.

FIG. 8 shows the light-emitting diodes 42 after the diodes are selectively released by the laser ablation. The pointed head portions 42a of the selected light-emitting diodes 42 are fitted into the recessed portions 43b provided at the surface of the silicone resin layer 43. The light-emitting diodes 42 are securely held on the side of the device holding substrate 44. If the recessed portions 43b are not provided, a problem would arise when the pointed head portions 42a fall down and are not positioned accurately because the pointed head portion of the devices cannot be sufficiently held by that surface of the substrate. When the recessed portions 43b are provided as in the present embodiment, the light-emitting diodes 42 are securely held.

Figure 9:
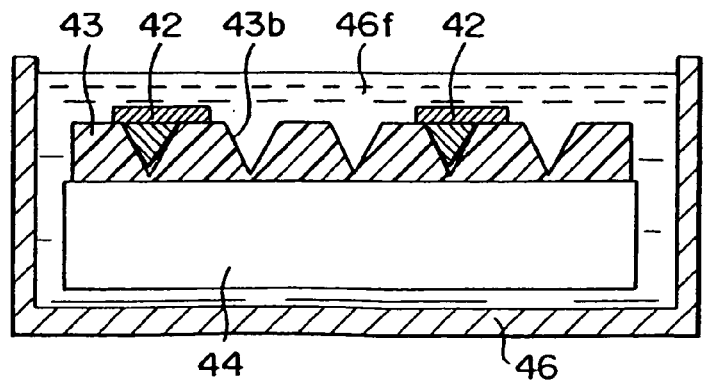
FIG. 9 is a sectional view showing the step of cleaning the light-emitting diodes in the method of transferring a device according to the embodiment of FIGS. 6A and 6B.

Next, as shown in FIG. 9, the device holding substrate 44 including the light-emitting diodes 42 held thereon is immersed in a cleaning liquid 46f in a cleaning tank 46. The metal or the like remaining on the surfaces of the light-emitting diodes 42 is removed through cleaning. The metal is constituted mainly of metallic Ga produced through evaporation of nitrogen by laser ablation. Alkali-based and acid-based etching liquids may both be used. In this step, also, where a silicone resin is particularly used as the silicone resin layer 43, the cleaning can be carried out with the light-emitting diodes 42 adhered to the surface 43a of the silicone resin layer 43. In addition, since the silicone resin is resistant to alkalis and acids, it is not eroded, and can sufficiently hold the light-emitting diodes 42.

Figure 10:
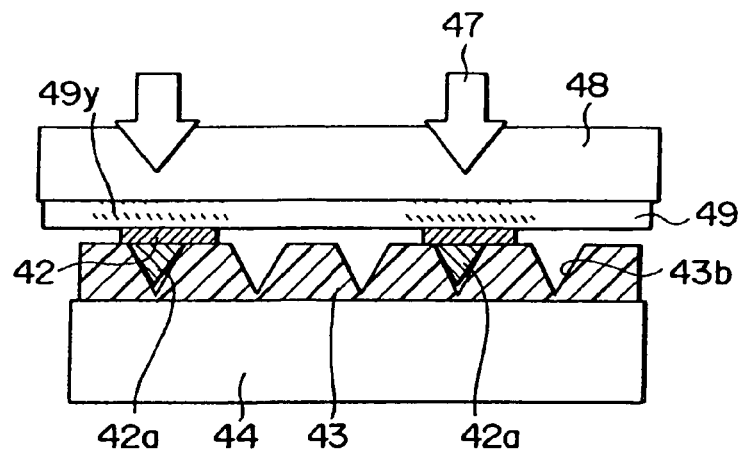
FIG. 10 is a sectional view showing the step of transferring the light-emitting diodes onto a second substrate in the method of transferring a device according to the embodiment of FIGS. 6A and 6B.
Figure 11:
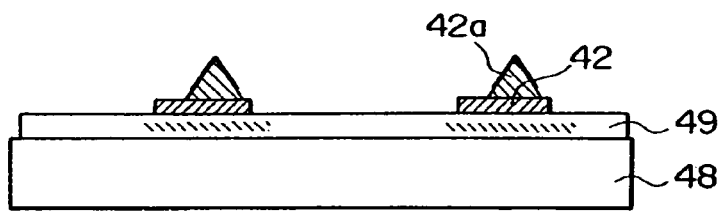
FIG. 11 is a sectional view showing the condition of the device after the transferring of the light-emitting diodes onto the second substrate in the method of transferring a device according to the embodiment of FIGS. 6A and 6B.

After the cleaning of the light-emitting diodes 42, as shown in FIG. 10, a second substrate 48 provided with an adhesive layer 49 on its major surface is prepared. The second substrate 48 includes a light-transmitting material such as quartz glass, and the adhesive layer 49 is formed with a UV-curable adhesive, a thermosetting adhesive, a thermoplastic adhesive or the like. The second substrate 48 includes an adhesive layer 49 on its major surface and is mated with the device holding substrate 44 having the light-emitting diodes 42 held thereon and energy light 47. The light-emitting diodes 42 on the device holding substrate 44 are transferred onto the second substrate 48. Where the adhesive layer 49 is formed of a UV-curable adhesive, irradiation with UV light as the energy light 47 can cure the adhesive layer 49. Therefore, by bringing uncured regions 49y of the adhesive layer 49 into contact with the light-emitting diodes 49 and then irradiating with UV light, the light-emitting diodes 42 can be securely adhered to the second substrate. Where the adhesive layer 49 is formed of a thermosetting adhesive or a thermoplastic adhesive, irradiation with infrared laser light causes adhesion through setting or re-melting. The adhesion of the light-emitting diodes 42 may be conducted through setting or re-melting of only the regions corresponding to the light-emitting diodes 42. Also, the adhesion of the light-emitting diodes 42 may also be conducted through setting or re-melting of the entire surface of the adhesive layer 49. Because the silicone resin layer 43 is formed as the device holding layer, even if the adhesive layer 49 and the silicone resin layer 43 make contact with each other, the excellent release property of the silicone resin ensures that the device holding substrate 44 can be easily released.

Finally, as shown in FIG. 5, the device holding substrate 44 is removed along with the silicone resin layer 43 including the recessed portions 43b, to yield the second substrate 48 onto which the light-emitting diodes 42 have been selectively transferred.

In the method of transferring a device as described above, the energy beam irradiates the interface between the devices and the first substrate, so that the release at the interface between the devices and the substrate is achieved in a short time by laser ablation and the devices are not damaged. Since the interface between the devices and the substrate is not specially formed but is formed spontaneously in the process of forming the devices, a thin release film is not needed. Thus an increase in the number of steps is minimized. In addition, since the light-emitting diodes 42 each have a pointed head portion 42a and the silicone resin layer 4 includes with the recessed portions 43b that fit the pointed head portions 42a, the light-emitting diodes 42 are securely adhered to the silicone resin layer 43, and are transferred without positional stagger. Therefore, an image display device or the like can be produced without lowering production.

The present embodiment is an embodiment of a device holding substrate including a silicone resin layer having recessed portions, and the method of producing the same. The producing method will be described with reference to FIGS. 12 to 14.

Figure 12:
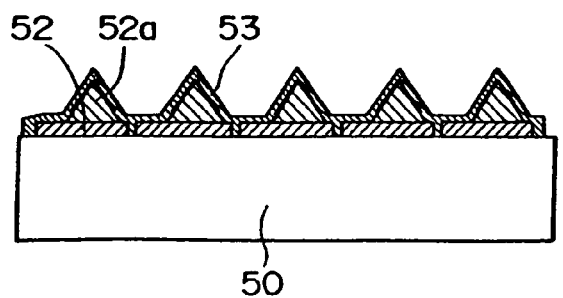
FIG. 12 is a sectional view showing the step of forming a release layer in a method of producing a device holding substrate according to an embodiment of the present invention.

First, as shown in FIG. 12, a number of light-emitting diodes 52, each having a hexagon pyramid shaped pointed head portion 52a, are formed on a sapphire substrate 50 in a matrix arrangement. The light-emitting diode 52 has the same constitution as the light-emitting diode shown in FIG. 6, and includes a nitride semiconductor material such as gallium nitride. The light-emitting diodes 52 are individually separated and disposed in a matrix arrangement on the sapphire substrate 50. A release layer 53 is provided on the light-emitting diodes 52. The release layer 53 can be a layer of Teflon and silicone, or other mold release agents as desired. In order not to damage the shape of the devices, the viscosity of the material of the release layer 53 is low. Control for obtaining such a low viscosity can be conducted by use of a solvent such as xylene.

Figure 13:
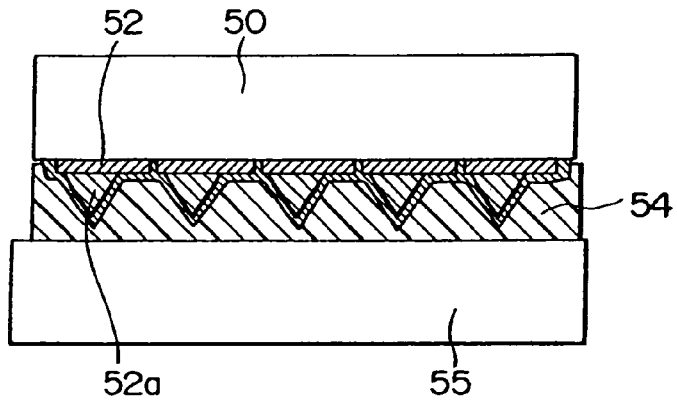
FIG. 13 is a sectional view showing the step of forming a silicone resin layer in the method of producing the device holding substrate according to an embodiment of the present invention.

After the release layer 53 covering the light-emitting diodes 52 is cured, as shown in FIG. 13, a device holding substrate 55 is positioned to face the sapphire substrate 50, and a silicone resin is injected so as not to generate voids between the device holding substrate 55 and the sapphire substrate 50. Then, the silicone resin flows into the spaces between the pointed head portions 52a of the light-emitting diodes 52 and is cured while reflecting the shape of the pointed head portions 52a of the light-emitting diodes 52. By the curing of the silicone resin, a silicone resin layer 54 includes recessed portions 54b shaped for fitting the pointed head portions 52a is formed on the device holding substrate 55.

Figure 14:
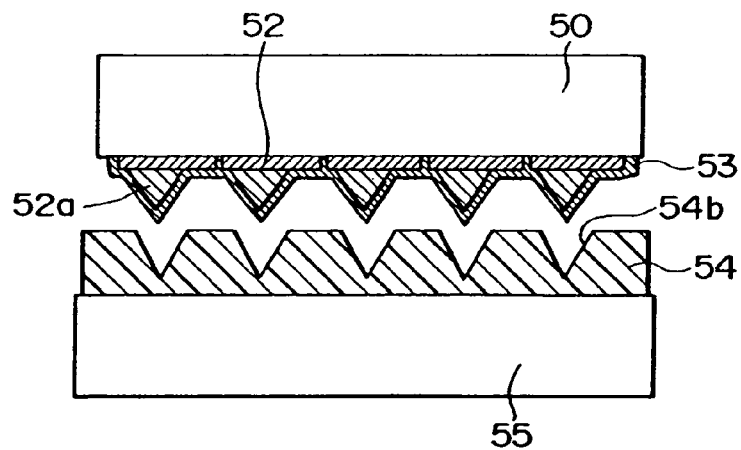
FIG. 14 is a sectional view showing the step of releasing the device holding substrate in the method of producing the device holding substrate according to an embodiment of the present invention.

Subsequently, the light-emitting diodes 52 used as molds are removed together with the sapphire substrate 50. As shown in FIG. 14, the device holding substrate 55 now includes the silicone resin layer 54 having recessed portions 54b shaped for fitting of the pointed head portions 52a. Now the sapphire substrate 50 can be easily released because the release layer 53 is formed on the light-emitting diodes 52.

By use of the device holding substrate 55 including the silicone resin layer 54 with recessed portions 54b for fitting of the pointed head portions 52a, the pointed head portions 52a and the recessed portions 54b are securely fitted to each other, and transfer without positional stagger is achieved. The silicone resin layer has the advantage of not generating laser ablation or the like, and can be easily handled in view of its resistance to alkalis and acids in relation to the cleaning liquid.

Figure 15:
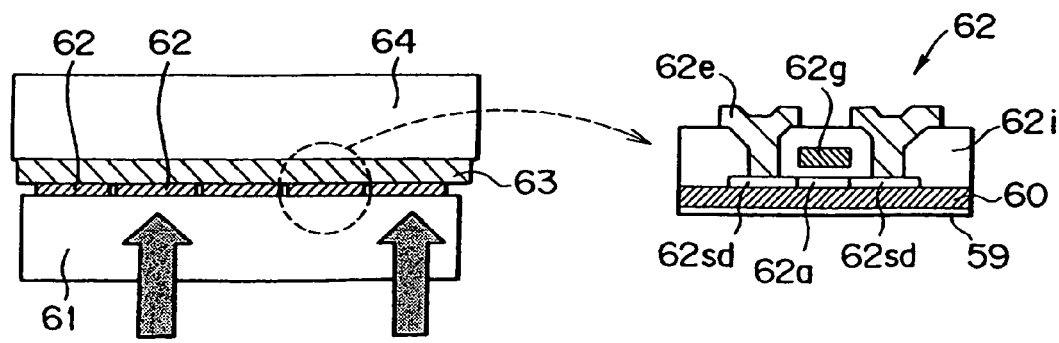
FIG. 15 is a sectional view showing the step of selectively irradiating the interface with laser light in a method of transferring a device according to an embodiment of the present invention.

The method of transferring a device according to a fourth embodiment will be described referring to FIGS. 15 to 19. The present embodiment is an example of the transfer of a thin film transistor device used in a liquid crystal display device. First, as shown in FIG. 15, a number of thin film transistor (TFT) devices 62 are formed in a matrix arrangement on a transparent substrate 61 such as glass as a light-transmitting first substrate. At this time, the thin film transistor devices 62 are formed at a pitch much smaller than the pitch of pixels as liquid crystal. In other words, the pitch can be enlarged at the time of transfer, so that the thin film transistor devices 62 themselves can be formed in a high density.

The structure of the thin film transistor device 62 is shown in an enlarged view at the right side of FIG. 15, in which a gate electrode layer 62g is provided on a semiconductor thin film 62a of recrystallized silicon or the like through a gate insulation film, and the semiconductor thin film 62a is formed on an insulation region 60 constituted, for example, of silicon oxide film or the like. The semiconductor thin film 62a and the gate electrode layer 62g are covered with an inter-layer insulation film 62i. The inter-layer insulation film 62i on source-drain regions 62sd, 62sd formed in the semiconductor thin film 62a is opened, where a wiring electrode 62e is formed. A release film 59 for causing laser ablation upon irradiation with a laser is provided on the lower side of the insulation region 60.

The thin film transistor device 62 is a device disposed for each pixel of an active matrix type liquid crystal display device as will be described later. The device is formed on a second substrate consisting of a transparent material such as glass and plastic so as to be spaced from the first substrate. It is to be noted that in the stage of FIG. 15, desired transistor regions have been formed but final wiring is not yet applied. The thin film transistor devices 62 are individually separated and are deposed in a matrix arrangement on the transparent substrate 61. The individual separation of the thin film transistor devices 62 can be achieved, for example, by RIE (reactive ion etching) or the like.

A device holding substrate 64 for temporarily holding the thin film transistor devices 62 is prepared, and a device holding layer 63 is provided on the surface of the device holding substrate 64 and positioned to face the transparent substrate 61. The device holding substrate 64 is a substrate having a desired stiffness, and may be one of various substrates such as a semiconductor substrate, a quartz glass substrate, a glass substrate, a plastic substrate and a metallic substrate. The device holding substrate 64 does not need to transmit light such as laser light, and therefore does not need to be formed of a light-transmitting material. The device holding layer 63 is an adhesive layer for temporarily adhering to the surface of the thin film transistor devices 62 and holding the thin film transistor devices 62. The device holding layer 63 can be formed of a thermoplastic resin, a thermosetting resin or the like, and particularly, a silicone resin is preferably used. The silicone resin does not suffer ablation even upon irradiation with excimer laser or YAG laser light, and only the devices can be released, so that production or yield is enhanced.

The device holding substrate 64 including the device holding layer 63 on its surface is positioned to face the major surface of the transparent substrate 61, and the number of thin film transistor devices 62 are pressed and adhered to the surface of the device holding layer 63 at a desired pressure. As shown in FIG. 15, selective irradiation with laser light such as excimer laser and YAG laser is conducted, to cause laser ablation at the interface between the selected thin film transistor devices 62 and the transparent substrate 61. By laser ablation, a gas is generated in the release layer 59 formed at a bottom portion of the thin film transistor devices 62, between the selected thin film transistor devices 62 and the transparent substrate 61. Therefore, the thin film transistor devices 62 can be released easily from the substrate. The laser light is preferably an excimer laser because the excimer laser has a high output in short wavelength regions, and therefore, instantaneous processing can be achieved. The laser light selectively irradiates the thin film transistor devices 62. For selective irradiation, a mask provided with desired opening portions or scanning with controlled irradiation and non-irradiation may be used. The release film 59, corresponding to the characteristics of the laser used for selective irradiation can be selected. For example, an amorphous silicon thin film, a nitride film or the like can be used.

FIG. 16 shows the condition where the thin film transistor devices 62 after the devices have been selectively released by laser ablation, in which the thin film transistor devices 62 are adhered to the surface 63a of the device holding layer 63 and are held on the side of the device holding substrate 64. By such a selective release, the device pitch on the first substrate can be enlarged. The spacing of the selected thin film transistor devices 62 can be set equal to the spacing of liquid crystal display devices, so that the thin film transistor devices 62 formed in a high density can be spaced apart on a substrate for mounting.

After desired cleaning and the like are performed, as shown in FIG. 17, a second substrate 68 including an adhesive layer 69 on its major surface is prepared. The second substrate 68 is formed of a light-transmitting material such as quartz glass, and the adhesive layer 69 may be formed by use of a UV-curable adhesive, a thermosetting adhesive, a thermoplastic adhesive or the like. The second substrate 68 includes with the adhesive layer 19 on its major surface and is mated with the device holding substrate 64 with the thin film transistor devices 62 held thereon. Then, irradiation with laser light is conducted, whereby the thin film transistor devices 62 on the device holding substrate 64 are transferred onto the second substrate 68. Where the adhesive layer 69 is formed of a UV-curable adhesive, irradiation with UV light as energy light causes curing of the adhesive layer 69. Therefore, by bringing uncured regions 69y of the adhesive layer 69 into contact with the thin film transistor devices 62 and then irradiating with UV light, the thin film transistor devices 62 can be securely adhered to the layer. Where the adhesive layer 69 is formed of a thermosetting adhesive or a thermoplastic adhesive, irradiation with infrared laser light causes adhesion through setting or re-melting. The adhesion of the thin film transistor devices 62 may be achieved through the setting or re-melting of only the regions corresponding to the thin film transistor devices 62, and the adhesion of the thin film transistor devices 62 may be achieved through the setting or re-melting of the entire surface of the adhesive layer 69. Where a silicone resin is used as the device holding layer 63, particularly, even when the adhesive layer 69 and the device holding layer 63 make contact with each other, the excellent release property of the resin ensures that the device holding substrate 64 can be easily released.

Next, as shown in FIG. 18, the device holding substrate 64 is removed together with the device holding layer 63, to yield the second substrate 68 onto which the thin film transistor devices 62 have been selectively transferred. At this stage, the thin film transistor devices 62 are arranged at positions conforming to the pixel pitch of the liquid crystal display device.

Figure 19:
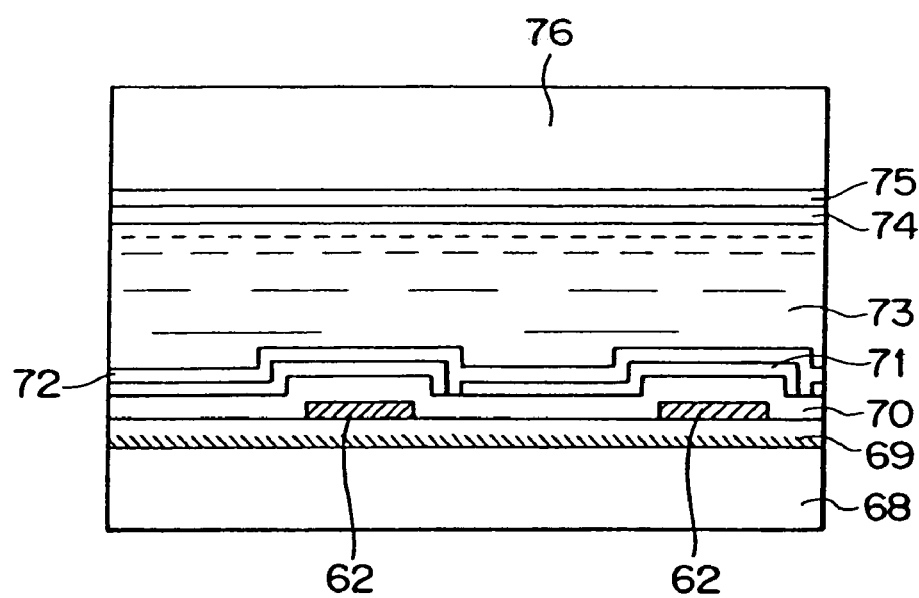
FIG. 19 is a sectional view showing the step of assembling a liquid crystal display device in the method of transferring a device according to an embodiment of the present invention.

After the thin film transistor devices 62 are transferred onto the second substrate 68 in accordance with the pixel pitch, as shown in FIG. 19, an inter-layer insulation film 70 is provided on the thin film transistor devices 62. The inter-layer insulation film 70 includes the desired window portions and wiring portions. Thereafter, pixel electrodes 71 constituted of transparent ITO or the like are provided for each pixel, and an oriented film 72 is provided thereon. In parallel to this, a common electrode 75 constituted of ITO film or the like is provided on a transparent counter substrate 76, and an oriented film 74 is provided thereon. Finally, the second substrate 68 and the transparent counter substrate 76 are positioned to face each other with a desired spacing therebetween, and a liquid crystal 73 is injected between the second substrate 68 and the transparent counter substrate 76, to complete the liquid crystal display device.

In the method of transferring a device as described above, the energy beam selectively irradiates the interface between the thin film transistor devices 62 and the first substrate, so that release at the interface between the devices and the substrate is achieved by laser ablation in a short time, and the devices are not damaged. In addition, the thin film transistor devices 62 are flat plate shaped devices, and are securely adhered to the device holding layer 63 constituted, for example, of a silicone resin or the like, and are transferred without positional stagger. Therefore, the liquid crystal display device can be produced while without lowering production. Since the thin film transistor devices 62 are formed in high density on the first substrate, a reduction in cost can be achieved through mass production. Besides, the thin film transistor devices 62 are selectively transferred in accordance with the pixel pitch, so that an increase in screen size of the liquid crystal display device can be easily achieved.

As has been described above, in the method of transferring a device according to the present invention, the energy beam selectively irradiates the interface between the devices and the first substrate, so that release at the interface between the devices and the substrate is achieved by laser ablation in a short period of time, and without damage to the devices. The interface between the devices and the substrate is not specially formed but is formed spontaneously in the process of forming the devices, so that formation of a thin film is not needed, and the increase in the number of steps is minimized.

In addition, where the light-emitting diodes have pointed head portions, the device holding layer is provided with recessed portions to fit the pointed head portions, so that the light-emitting diodes are securely adhered to the device holding layer, and are transferred without positional stagger. Therefore, the image display device or the like can be produced without lowering production. Besides, even where the light-emitting diodes or the thin film transistor devices of the liquid crystal display device are flat plate shaped devices, the light-emitting diodes or the thin film transistor devices are securely adhered to the device holding layer in the same manner as above, and are transferred without positional stagger.

In addition, in the device holding substrate and the method of producing the same according to the present invention, the device holding layer includes recessed portions that are securely formed on the layer to fit the pointed head portions of the devices. This is applied to the above-described method of transferring a device, whereby transfer can be achieved in a short time without causing an increase in the number of steps.

The present invention is not limited to the details of the above described preferred embodiments. The scope of the present invention is defined by the appended claims and all changes and modifications as fall within the equivalence of the scope of the claims are therefore to be embraced by the present invention.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A method for transferring a device, comprising:
irradiating, selectively, an interface between a first substrate and a device included on the first substrate with an energy beam and transmitting the energy beam through the first substrate to selectively release the device;
transferring the released device onto a device holding layer included on a device holding substrate; and
transferring the device from the device holding layer onto a second substrate, wherein the device holding layer is a silicone resin layer.

2. A method for transferring a device, comprising:
irradiating, selectively, an interface between a first substrate and a device having one of a pointed head portion and a flat plate-shaped structure, included on the first substrate with an energy beam and transmitting the energy beam trough the first substrate to selectively release the device;
transferring the released device onto a device holding layer included on a device holding substrate; and
transferring the device from the device holding layer onto a second substrate, wherein the device holding layer is a silicone resin layer.

3. A method for transferring a device, comprising:
irradiating, selectively, an interface between a first substrate and a device included on the first substrate with an energy beam to selectively release the device;
transferring the released device onto a device holding layer included on a device holding substrate;
cleaning the device on the device holding layer; and
transferring the device from the device holding layer onto a second substrate, wherein the device holding layer is a silicone resin layer.

4. A method for transferring a device, comprising:
irradiating, selectively, an interface between a first substrate and a device included on the first substrate with an energy beam and transmitting the energy beam through the first substrate to selectively release the device;
transferring the released device onto a device holding layer included on a device holding substrate;
cleaning the device on the device holding layer after the device is transferred onto the device holding layer; and
transferring the device from the device holding layer onto a second substrate, wherein the device holding layer is a silicone resin layer.

5. A method for transferring a device, comprising:
irradiating, selectively, an interface between a first substrate and a device included on the first substrate with an energy beam and transmitting the energy beam through the first substrate to selectively release the device, wherein the device is formed of a nitride semiconductor material which produces ablation upon irradiation with the energy beam, and wherein the ablation is generated by the selective irradiation with the energy beam to cause exfoliation at an interface between the device and the first substrate;
transferring the released device onto a device holding layer included on a device holding substrate; and
transferring the device from the device holding layer onto a second substrate, wherein the device holding layer is a silicone resin layer.

6. A method for transferring a device, comprising:
irradiating, selectively, an interface between a first substrate and a device included on the first substrate with an energy beam and transmitting the energy beam through the first substrate to selectively release the device, wherein the first substrate is a sapphire substrate;
transferring the released device onto a device holding layer included on a device holding substrate; and
transferring the device from the device holding layer onto a second substrate, wherein the device holding layer is a silicone resin layer.

* * * * *